*(12)* United States Patent
Aker et al.

(10) Patent No.: US 7,651,811 B2
(45) Date of Patent: Jan. 26, 2010

(54) THERMAL MANAGEMENT OF FAST CHARGING HIGH CAPACITY BATTERIES

(75) Inventors: John F. Aker, Barboursville, VA (US); James R. Wade, Palmyra, VA (US)

(73) Assignee: Aker Wade Power Technologies, LLC, Ruckersville, VA (US)

( * ) Notice: Subject to any disclaimer, the term of this patent is extended or adjusted under 35 U.S.C. 154(b) by 860 days.

(21) Appl. No.: 10/767,108

(22) Filed: Jan. 28, 2004

(65) Prior Publication Data

US 2005/0162829 A1    Jul. 28, 2005

(51) Int. Cl.
*H01M 2/12* (2006.01)
*H01M 2/36* (2006.01)
*H01M 1/50* (2006.01)
*H01M 2/00* (2006.01)

(52) U.S. Cl. .......................... 429/71; 429/72; 429/120; 429/148

(58) Field of Classification Search ................. 429/148, 429/71, 72, 120
See application file for complete search history.

(56) References Cited

U.S. PATENT DOCUMENTS

| | | | |
|---|---|---|---|
| 3,904,439 A * | 9/1975 | Barrett, Jr. ................... | 429/99 |
| 4,206,273 A | 6/1980 | Mandil | |
| 5,800,942 A * | 9/1998 | Hamada et al. ............. | 429/148 |
| 6,204,769 B1 * | 3/2001 | Arai et al. .................... | 340/632 |
| 6,549,014 B1 | 4/2003 | Kutkut et al. | |
| 6,690,576 B2 * | 2/2004 | Clements et al. ............ | 361/695 |

FOREIGN PATENT DOCUMENTS

EP    0 771 037 B1    5/2001

* cited by examiner

*Primary Examiner*—Patrick Ryan
*Assistant Examiner*—Julian Mercado
(74) *Attorney, Agent, or Firm*—Steven J. Hultquist; Intellectual Property/Technology Law

(57) ABSTRACT

A thermal management system for fast charging and subsequent heavy use operation of high-capacity batteries. The thermal management system includes at least one motive driver arranged to impinge air on the terminal and strap structure of the high capacity battery. The terminal and strap structure in a specific aspect of the invention is protectively shrouded by a cover including a main top surface member having air inflow openings therein and a circumscribing wall depending downwardly therefrom and provided with gas egress openings along its medial and end portions. Such cover allows a high flux flow of air therethrough, for high efficiency cooling of the battery during fast charging and subsequent heavy use operation.

26 Claims, 18 Drawing Sheets

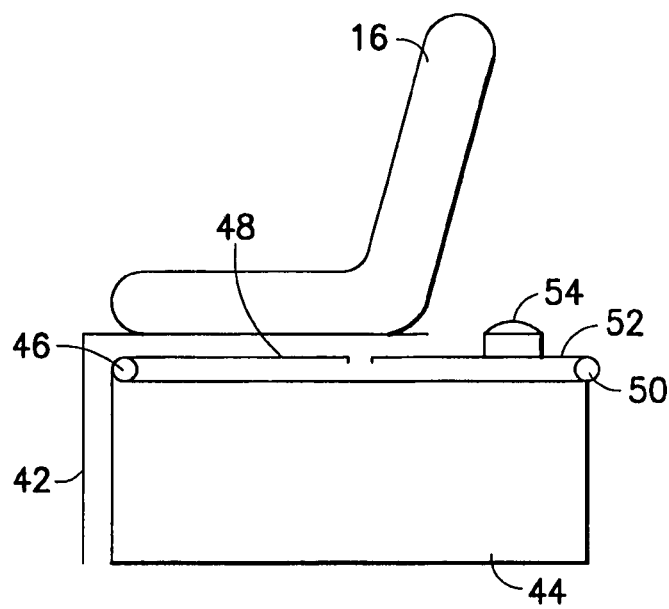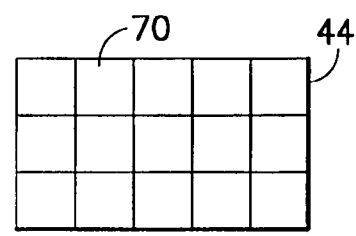
FIG.3　　　　FIG.4
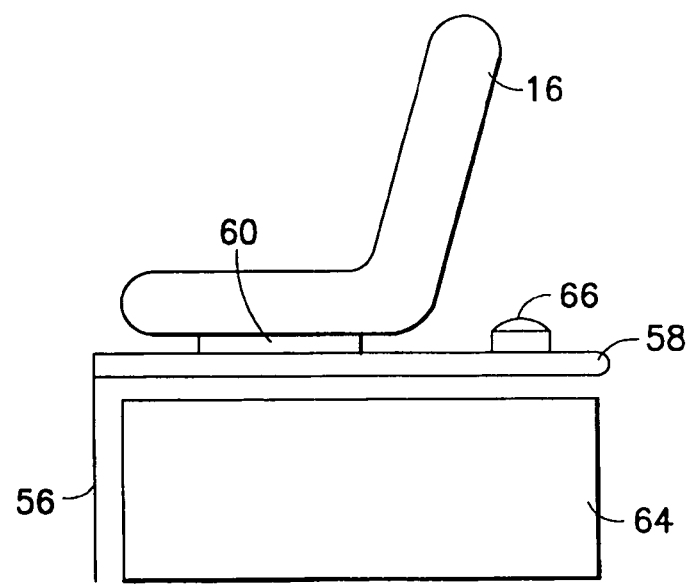
FIG.5

THERMAL MANAGEMENT OF FAST CHARGING HIGH CAPACITY BATTERIES

BACKGROUND OF THE INVENTION

1. Field of the Invention

This invention pertains to thermal management of fast charging high capacity batteries, and to associated cooling structures and methods for maintaining optimal efficiency in fast charging and subsequent use of such batteries.

2. Description of the Related Art

"Fast charging" refers herein to charging a battery at a rate of greater than 30 amperes per 100 ampere-hours of battery capacity. A goal of fast charging is to bring the state of charge ("SOC") of a battery from 30% to 80% of full charge in less than about 1.5 hours.

Battery-powered vehicles such as forklifts, electric carts and the likes are widely used in industry and require periodic recharging of batteries to maintain vehicle operability.

U.S. patent application Ser. No. 10/287,753 filed Nov. 4, 2002 in the names of John F. Aker and James R. Wade for "FAST CHARGER FOR HIGH CAPACITY BATTERIES," issued as U.S. Pat. No. 6,803,746 on Oct. 12, 2004, describes high-efficiency fast chargers for fast charging of high-capacity batteries. The disclosure of such prior co-pending U.S. patent application Ser. No. 10/287,753 is hereby incorporated herein by reference, for all purposes. "High capacity batteries" as used herein refers to batteries of greater than about 100 Amp-hours capacity.

As disclosed in the background section of our prior co-pending patent application, conventional battery chargers typically operate at charging rates that are about or below 20 amperes per 100 ampere-hours of battery capacity. In consequence, the charging rate of such conventional battery chargers decreases early in the charge cycle, and 8-12 hours are required to restore the battery to full charge status.

The fast charger apparatus and method disclosed in such prior co-pending application overcomes the deficiencies of conventional charging approaches, and permits lead-acid batteries commonly used to power forklifts, and other electric vehicles, to be safely charged at higher currents, in a highly effective manner, bringing batteries from 30% to 80% state of charge in about an hour. The charging enabled by the fast charging system of such prior co-pending application is on the order of 400% faster than conventional charging technologies.

By such high-rate, high-efficiency charging afforded by the fast charging system described in our prior co-pending application, it is possible to operate fleets of battery-powered vehicles without changing out batteries, thereby obviating the time, effort and lost productivity costs of such change-outs. The fast charging system of our prior co-pending application thereby permits a substantial increase in fleet productivity for such electric battery-powered vehicles. As a result, a typical operation requires at least 50% fewer batteries, in addition to the power savings realized by such systems.

In operation, the fast charging systems of our prior copending application entail unique thermal management issues in the high rate, high-efficiency regime involved in the charging operation. Specifically, the high-rate intensive charging enabled by the apparatus and method of our prior co-pending application along with constant use in a heavy two or three shift operation without time for the traditional "cool down" period, produces substantial increases in battery temperature during the charging operation. Such temperature increases in turn require charging current to be reduced in order to maintain battery temperature at a safe level to achieve desired battery life.

This occurrence of substantial increases in battery temperature during fast charging and heavy use applications undesirably impacts the fast charging operation by increasing the time required for a battery to achieve the targeted state of charge. In addition, higher battery temperatures result in reduced battery life and possible warranty issues with the battery. As a result, the potential benefits inherent in fast charging have not yet been fully realized. This is the problem to which the present invention is directed.

SUMMARY OF THE INVENTION

The present invention relates to battery cooling structures and methods usefully employed and uniquely suited for fast charging and heavy use applications of high capacity batteries.

In one aspect, the invention relates to a thermal management system for high-capacity battery cooling. The thermal management system includes at least one of (I) a cooling gas motive driver, constructed and arranged to direct cooling gas on at least a portion of the high-capacity battery during at least one of (a) fast charging of the battery, and (b) use of the battery generating heat, and (II) a terminal and strap cover mountable on a terminal of the battery to cover the terminal and a strap connected thereto, the cover including a main top member and a circumscribing sidewall joined to the main top member, wherein the main top member has openings therein for flow of cooling gas therethrough, and the circumscribing sidewall includes side portions and end portions, wherein the side portions and end portions have openings therein for flow of cooling gas therethrough.

In another aspect, the invention relates to a battery-powered vehicle including a thermal management system as described above.

A further aspect of the invention relates to a cover for mounting on terminal and strap structure of a battery. The cover includes a main top member of elongate form, having an array of openings therein, with the main top member being joined at its edges to a downwardly extending circumscribing wall terminating at its lower end in an open bottom face communicating with an interior volume of the cover, with the circumscribing wall including openings along end portions and medial portions thereof.

Yet another aspect of the invention relates to a method of thermally managing a high-capacity battery including terminal and strap structure, at least during fast charging of the battery. The method includes directionally flowing cooling gas onto the terminal and strap structure of the battery to dissipate heat generated by the battery.

Other aspects, features and advantages of the invention will be more fully apparent from the ensuing disclosure and appended claims.

BRIEF DESCRIPTION OF THE DRAWINGS

FIG. 3 is a schematic view of a portion of the forklift battery-powered truck shown in FIG. 1.

FIG. 4 is a top plan view of the opened battery compartment of FIGS. 1 and 3, showing the array of battery cells positioned therein.

FIG. 5 is a schematic view of a portion of the forklift battery-powered truck shown in FIG. 2.

DETAILED DESCRIPTION OF THE INVENTION, AND PREFERRED EMBODIMENTS THEREOF

The present invention reflects the discovery that adverse thermal effects, as incident to fast charging and subsequent heavy use operation of high-capacity batteries without allowance for the customary cool down period, may be efficiently ameliorated by forced-air cooling of high-capacity batteries, e.g., as mounted on a forklift battery-powered truck or other powered installation or vehicle, particularly when heat transfer-enhancing protective battery terminal and strap covers are employed to enhance such forced-air cooling of the batteries.

In one embodiment, the invention relates to a motive vehicle utilizing one or more batteries for powering the vehicle, in which the batteries are cooled by a dedicated fan assembly for forced-air convective heat transfer, to dissipate heat incident to fast charging.

In another embodiment, the invention relates to protective covers for battery terminals and strap elements. Such covers accomplish the dual function of (i) reducing the occurrence of short-circuiting of the battery during its handling and in-service use, as well as (ii) enhancing the dissipation of heat associated with fast charging and subsequent heavy use operation of the battery.

The features and advantages of the invention are more fully appreciated with reference to the illustrative embodiments hereafter described in reference to the drawings.

Figure 1:
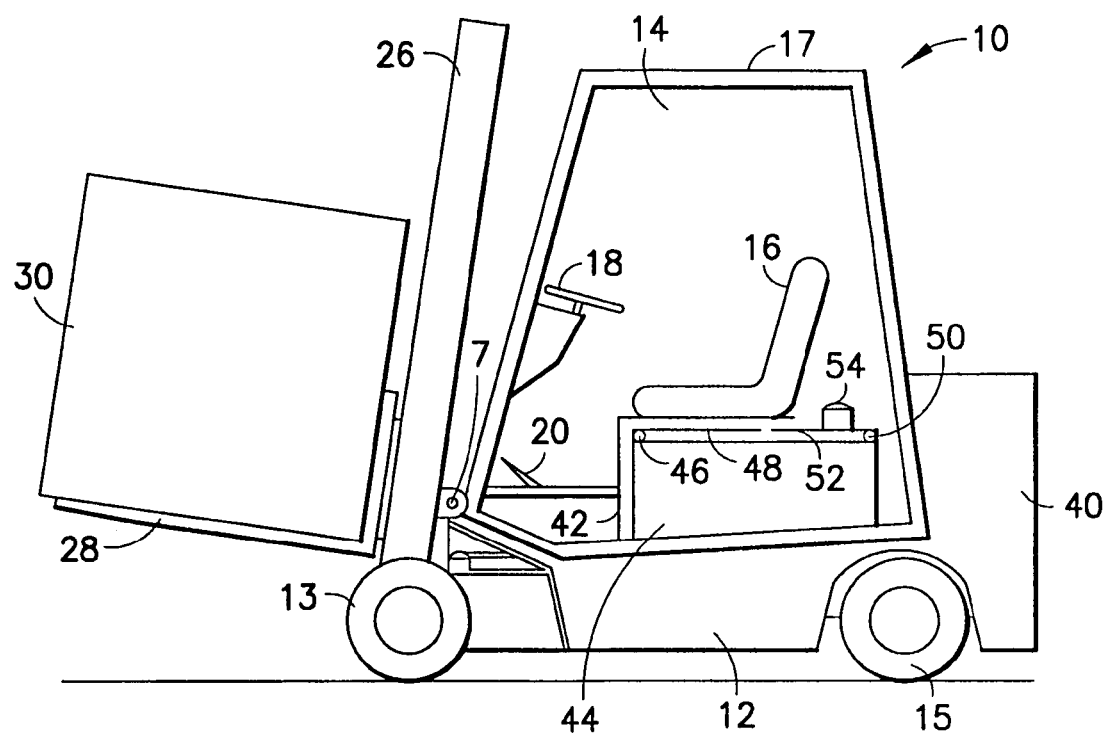
FIG. 1 is a side elevation view of a forklift battery-powered truck in a first configuration, incorporating a thermal-management system according to one embodiment of the invention.

FIG. 1 is a side elevation view of a forklift battery-powered truck 10 in a first configuration, incorporating a thermal-management system according to one embodiment of the invention.

The forklift battery-powered truck 10 as illustrated includes a vehicular body or chassis 12, having wheels 13 and 15 mounted thereon. Each of these wheels obscures a corresponding wheel at the other side of the vehicle, behind the wheel illustrated at the front and rear of the vehicle. Either or both of the front and rear pairs of wheels may be arranged for driven operation by an electric drive motor (not shown) mounted within the body of the vehicle.

On the chassis 12 is provided a cockpit enclosure 14, surrounded by the cockpit frame 17. In the cockpit enclosure 14 is mounted a driver seat 16, in appropriate relation to the steering wheel 18 and accelerator 20, with other controls being provided in a manner conventional in the art of battery-powered vehicles. The seat 16 is mounted on a seat support bracket 42.

At the front portion of the forklift battery-powered truck 10, a lift frame 26 is provided, on which is mounted the forklift member 28 that is illustrated as carrying load 30. The lift frame 26 is pivotally mounted on the hinge 7 for pivotal translational movement in a conventional manner.

The rear portion of the chassis 12 of forklift battery-powered truck 10 includes a counterweight structure 40 to stabilize the vehicle even when heavy loads are being carried on the lift frame 26.

Below the seat 16 is mounted on seat support bracket 42 is a battery compartment 44 arranged to contain a battery assembly of high-capacity lead-acid batteries whose terminals are interconnected to one another by battery straps. The terminals and battery straps may be covered by battery terminal and strap covers constructed in accordance with a preferred aspect of the present invention, as hereinafter more fully described.

The battery compartment 44 is equipped with a hinged lid structure, including lid section 48 mounted on hinge 46 secured to the battery compartment, and lid section 52 mounted on hinge 50 secured to the battery compartment.

Mounted on lid section 52 is a forced-air downdraft fan 54 providing forced down-flow of air from the ambient environment of the forklift battery-powered truck over the batteries in the battery compartment 44. In the view shown in FIG. 1, a second fan located directly behind the illustrated fan 50 is also provided, but not visible in the drawing. It will be recognized that by provision of such downdraft fan assembly, ambient air is forced downwardly over the batteries, including the terminals and straps thereof, to provide cooling by convective heat transfer.

The cooling effected by the forced-air cooling fans, optionally including the terminal and strap covers of the invention overlying the terminals of the strapped batteries in the array, is of sufficient character to thermally stabilize the batteries, during their fast charging as well as during subsequent heavy use operation.

In this manner, the fast charging is accommodated by the batteries without having to reduce the charging current in order to avoid undue heat build-up. By dissipating the heat generated by the fast charging operation, the thermal management system of the invention permits the fast charging to be completed in a very short time-frame, relative to prior art practice.

Further, the thermal management system of the invention permits the batteries after such fast charging to be immediately placed into service, rather than having to cool down before being deployed.

Still further, during subsequent heavy use operation, the thermal management system of the invention permits the batteries to "run cool" so that they can be usefully operated for extended periods of time, relative to "hot running" operation characteristic of prior art high capacity batteries lacking the thermal management system of the present invention.

As a result, batteries utilized with the thermal management system of the invention are able to be deployed in three-shift operation, without the limitations of the prior art. In prior practice, as mentioned, high capacity batteries during fast charging required reduction of the charging current to avoid undue heat build-up, and/or the hot batteries at the end of fast charging would require a cool-down before they were placed in use. Subsequently, heavy use operation would cause heat-up of the battery, requiring interruption of service to accommodate cool-down of the batteries.

The thermal management system of the invention overcomes such deficiencies. In a three-shift operation, comprising three eight-hour shifts, wherein thermal management system of the invention is employed in application to battery-powered fork lift trucks, the approximately one hour required for fast charging can be accommodated during a meal break of the fork lift operator, and the fork lift can otherwise be used throughout the three shifts. The invention thereby enables a substantial improvement in productivity to be realized.

Referring again to FIG. 1, the down-draft fans mounted on lid section 52 may be powered in any suitable fashion, and may be operated to provide forced-air cooling of the high capacity batteries during fast charging of the batteries, as well as optionally during operation of the forklift battery-powered truck 10 as utilized in normal in-service operation. The down-draft fans may be powered during the fast charging operation by an exterior power supply coupled in power-supplying relationship to the fans, or the fans may be powered by the high-capacity batteries while the batteries are undergoing fast charging. When the fans are actuated during in-service operation of the vehicle, the downdraft fans are advantageously powered by the batteries on the forklift truck. Alternatively, the fans may be powered by an independent power supply on the forklift battery-powered truck.

It will be appreciated that the number and placement of down-draft fans mounted on the lid section 52 may be widely varied, depending on the number and size of batteries in the battery compartment, the size of down-draft fans that are employed, the volumetric flow rating of the utilized fans, and their power requirements.

The forklift battery-powered truck 10 shown in FIG. 1 thus provides an efficient configuration for dissipation of heat generated by the high-capacity batteries in the battery assembly 44 during fast charging and heavy use operations. The forced downdraft air sweeping the terminal and strap structure of the battery assembly serves to transport sensible heat from the batteries and to maintain a reduced temperature of the batteries during fast charging. In consequence, the ultimate state of charge can be obtained in a particularly efficient manner, in less time than would otherwise be required if the heat generation incident to fast charging and heavy use operations were not dissipated.

It will be recognized that the arrangement shown in FIG. 1 is of an illustrative character only, and that other means and methods of forced-air cooling and flow of cooling air over the batteries may be employed. It will also be recognized that the battery-powered vehicle may be of various types and configurations, the possibilities ranging from a battery powered golf cart to a 12,000-pound material handling truck, and beyond.

For example, rather than being mounted on the lid section 52, the fans may be mounted on the frame or on the chassis of the forklift battery-powered truck 10, and arranged for forced flow of air over the batteries. The fans can even be mounted on the forklift battery-powered truck 10 at locations remote from the batteries, with appropriate ducting or other flow passages to channel the forced-air flow stream to the batteries, although it is preferred in practice to position the fans in close proximity to the batteries to achieve high heat transfer efficiency.

It will thus be appreciated that a wide variety of specific structural arrangements may be employed to directionally flow air so as to remove waste heat from the fast chargeable battery assembly.

In all instances, a forced-air driver is employed to motively drive cooling air in a directional manner, so that the battery is cooled during the fast-charging operation, and optionally, during normal in-service operation. The arrangement shown in FIG. 1 with downdraft fans is particularly advantageous, since cooling air thereby is directed onto the terminals and terminal straps of the battery assembly, to maximize the heat transfer gradient and dissipate heat generated by the battery. In lieu of fans, any other motive drivers for cooling air may be employed, such as blowers, compressors, eductors, turbines, ejectors, etc.

During heavy use operation subsequent to fast charging of the batteries, the fans may be actuated to provide the desired extent of cooling of the batteries. While the fans can be arranged for continuous in-service operation, it may be preferable to arrange the fans so that they are actuated only when temperature of the batteries exceeds a predetermined level, so that cooling energy is not unnecessarily expended in service.

For example, battery cooling may be unnecessary even during heavy use operation if the ambient temperature of the environment in which the forklift battery-powered truck is operating is sufficiently low to maintain the batteries in a cool condition, e.g., near-freezing temperatures on a loading dock or in a warehouse. In other instances, e.g., of light intermittent usage of the forklift battery-powered truck, the batteries may remain sufficiently cool so that they do not require actuation of the fans for forced-air convective cooling.

Accordingly, the invention contemplates arrangements in which the fans are only actuated in use of the forklift battery-powered truck when the temperature of the batteries exceeds a predetermined set point value. For such purpose, the batteries may have associated therewith thermal monitoring circuitry including monitoring devices such as thermocouples, thermistors, etc., which monitor temperature of the batteries and responsively prompt the thermal monitoring circuitry to actuate the cooling fans when battery temperatures rise above the set point value, so that cooling operation is initiated to maintain the temperature below the threshold temperature for fan actuation.

The thermal monitoring circuitry may therefore include thermostat circuitry operatively constructed and arranged for switching on the cooling fans under excess heat generation conditions, to maintain temperature of the batteries at a level consistent with extended in-service operation.

Figure 2:
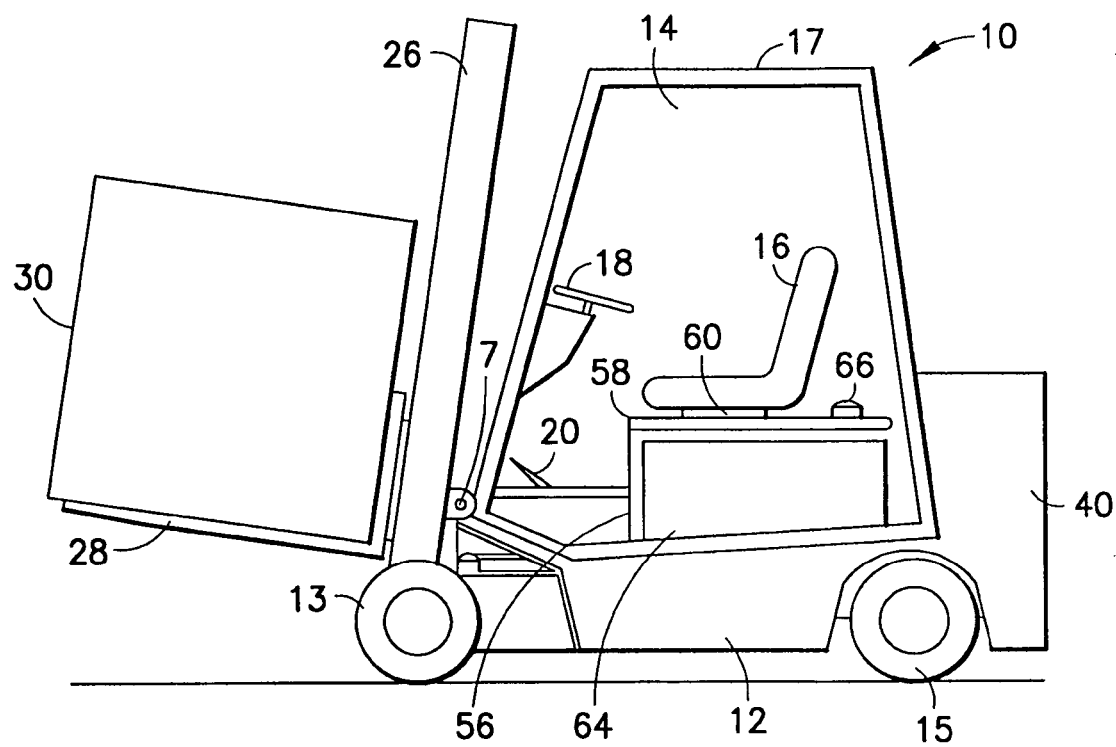
FIG. 2 is a side elevation view of a forklift battery-powered truck in a second configuration, incorporating a thermal-management system according to another embodiment of the invention.

FIG. 2 is a side elevation view of a forklift battery-powered truck in a second configuration, incorporating a thermal-management system according to another embodiment of the invention. The structural parts of the FIG. 2 forklift vehicle are numbered correspondingly to the same parts of the forklift vehicle shown in FIG. 1.

As illustrated, the FIG. 2 forklift vehicle is constructed differently from the FIG. 1 forklift vehicle as regards the battery arrangement. In the FIG. 2 forklift vehicle, the battery assembly 64 is positioned on the vehicle below a shroud 58, typically formed of fiberglass. The shroud 58 at its forward end is joined to compartment plate 56 as shown. Seat 16 is disposed on seat mount 60 on the shroud 58. Fan 66 is mounted on the shroud 58 behind the seat 16, and arranged for down-flow of air onto the battery assembly below the shroud to effect battery cooling so that undue heat build-up is avoided. In the view shown in FIG. 2, a second fan located directly behind the illustrated fan 66 is also provided, but not visible in the drawing.

FIG. 3 is a schematic view of a portion of the forklift battery-powered truck shown in FIG. 1, wherein all parts and structural features in FIG. 3 are numbered correspondingly to FIG. 1.

The battery compartment 44 includes a box, typically constructed of steel or other suitable metal, that is equipped with a hinged lid structure, including lid section 48 mounted on hinge secured to the box, and lid section 52 mounted on hinge 50 secured to the box.

Mounted on lid section 52, in a receiving opening therein, is a forced-air down-draft fan 54 (with a second fan located directly behind the illustrated fan 54, but not visible in the drawing) providing forced down-flow of air from the ambient environment of the forklift battery-powered truck over the batteries in the battery compartment 44.

FIG. 4 is a top plan view of the opened battery compartment 44 of FIGS. 1 and 3, showing the array of battery cells 70 therein. The battery cells 70 are shown in schematic form, without terminal or strap structures, for ease of illustration, it being understood that such cells are operatively coupled for supplying power to the forklift vehicle.

FIG. 5 is a schematic view of a portion of the forklift battery-powered truck shown in FIG. 2. The battery assembly 64 is positioned below the shroud 58 that is joined at its forward end to the compartment plate 56 with seat 16 is disposed on seat mount 60 on the shroud 58. Fan 66 is mounted in a suitable receiving opening on the shroud 58 behind the seat 16 (with a second fan located directly behind the illustrated fan 66, but not visible in the drawing).

Figure 6:
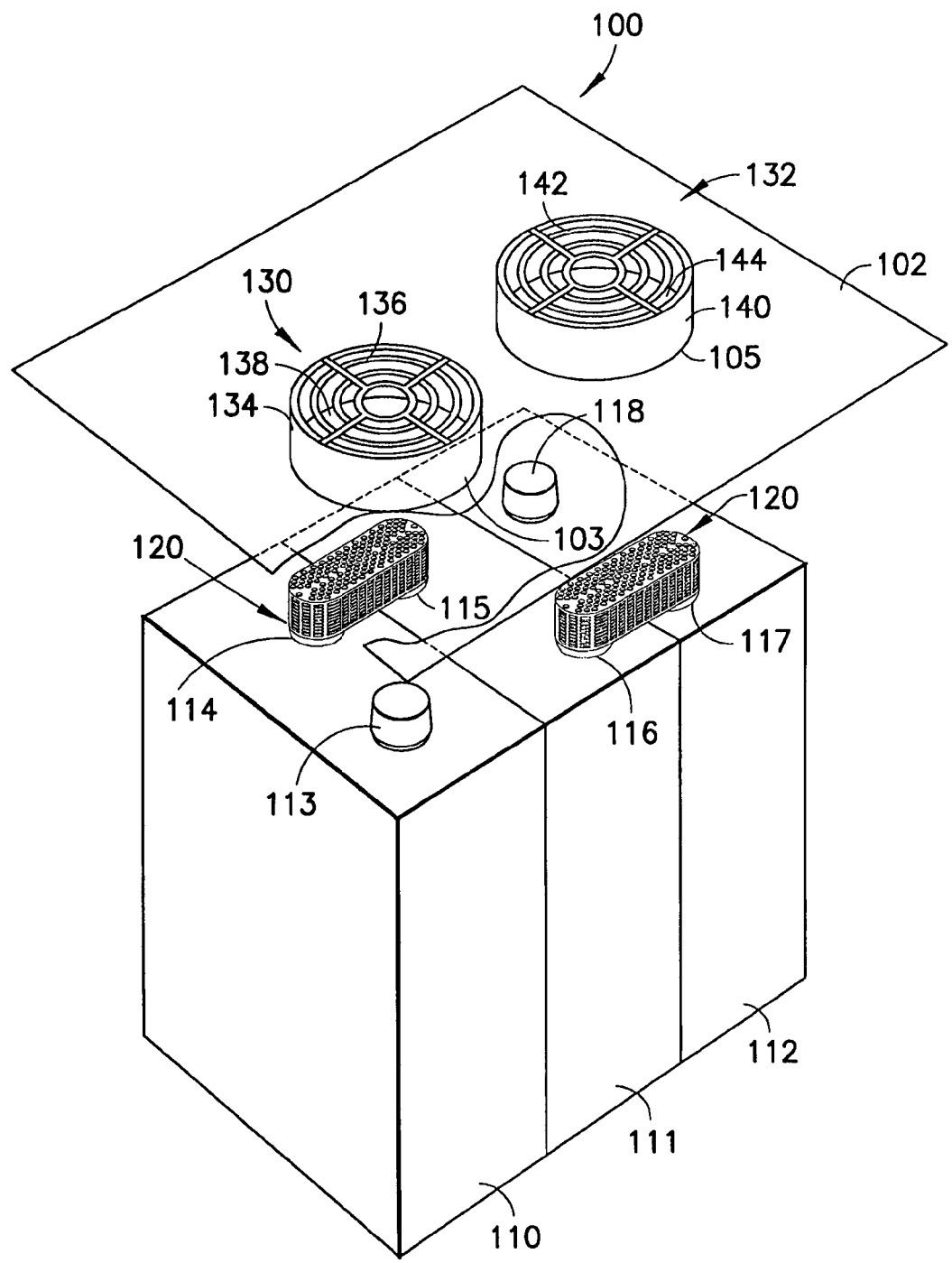
FIG. 6 is a perspective view of a lead-acid battery array disposed beneath a plate member equipped with a dual-fan system for thermal management during fast charging and heavy use applications of the battery array, wherein the terminals and associated straps of the array are overlaid by a foraminous protective cover constituting a further aspect of the thermal management system.

FIG. 6 is a perspective view of an illustrative lead-acid battery array disposed beneath a plate member equipped with a dual-fan system for thermal management during fast charging and heavy use applications of the battery array, wherein the terminals and associated straps of the battery array are overlaid by a foraminous protective cover constituting a further aspect of the thermal management system.

As illustrated, the lead-acid battery array includes batteries 110, 111 and 112 whose output terminals include terminals 113, 114, 115, 116, 117 and 118. Respective lead battery straps (not visible in the FIG. 6 drawing) interconnect terminals 114 and 115, and terminals 116 and 117. A battery terminal and strap cover 120 overlies terminals 114 and 115 and the strap interconnecting them, so that the respective end portions of the cover 120 overlie the terminals 114 and 115, and the medial portion of the cover overlies the lead strap between such terminals.

In like manner, a corresponding battery terminal and strap cover 120 overlies terminals 116 and 117, and the strap interconnecting them.

In accordance with the invention, the battery terminal and strap covers 120 are formed to accommodate flow-through of cooling air in a way that enhances the dissipation of heat from the terminals and interconnecting straps of the battery assembly.

The battery assembly is disposed beneath a plate member 102, which may be a hinged lid, shroud section, shelf, or other structural member on which the fan assemblies 130 and 132 are mounted to downwardly direct air onto the batteries in the battery assembly for cooling thereof, to prevent undue heat build-up in the batteries.

The fan assembly 130 includes a cylindrical collar 134 disposed in opening 103 in plate 102. An overlying protective grate member 136 is mounted at the top open end of the collar member 134. A fan 138 is mounted in the interior of the collar 134, and arranged for effecting down-flow of air drawing from the ambient environment through the grate member 136.

In like manner, the fan assembly 132 includes a cylindrical collar member 140 mounted in opening 105 in plate member 102. A protective grate member 142 is mounted to overlie the upper open end of the collar member 140. A fan 144 is mounted in the collar member 140 to effect down-flow of air drawn from the ambient environment through grate member 142 onto the underlying battery assembly.

In operation of the thermal management system and battery assembly shown in FIG. 6, fast charging is carried out when the state of charge of the batteries 110, 111, and 112 has declined as a result of their operational use, to a predetermined low level. The battery assembly once it reaches the predetermined low level is connected to a fast charging system (not shown in FIG. 6), to recharge the batteries 110, 111, and 112 to a predetermined high state of charge, for resumption of normal in-service operation. Alternatively, the fast charging may be initiated after a predetermined in-service period of time has elapsed, as part of a fixed schedule of charging and in-service operation.

During the fast charging operation, the fast charger apparatus is suitably coupled with terminals of the battery assembly. The fast charger employed in such fast charging operation may be of any suitable type, e.g., a fast charging apparatus of the type shown and described in our prior co-pending U.S. patent application Ser. No. 10/287,753 filed Nov. 4, 2002.

During the fast charging operation, the fans 138 and 144 of respective fan assemblies 130 and 132 are actuated, to drive air downwardly from the ambient environment, for flow over the terminals and associated straps of the battery assembly, and subsequently away from the battery assembly, as continuing flow displaces air from the location of the battery assembly, e.g., by lateral outward flow at the openings between the battery compartment 44 and the overlying hinged lid sections 48 and 42 in the forklift vehicle of FIG. 1, or at the side edges of the shroud 58 in the forklift vehicle of FIG. 2.

In such manner, the forced down-flow of air during the fast charging cooling operation and in subsequent heavy use operation provides a flux of cooling air to dissipate heat from the battery in a highly effective manner.

Thus, the fans 138 and 144 may be actuated not only during the fast charging operation, but also during normal in-service operation of the battery assembly, e.g., in an intermittent or continuous manner, as appropriate in a given application of the invention. For such purpose, the battery assembly may have associated therewith a thermocouple, thermistor, thermostat or other temperature-monitoring element that is coupled to the power supply and/or switches associated with the fans 138 and 144, so that the fans are actuated during normal in-service operation when temperature at or in the vicinity of the battery reaches a predetermined level. Alternatively, the fans may be arranged for continuous operation, at all times during which the battery is actively being discharged in use. For this purpose, load sensing or current draw monitoring circuitry may be employed, to switch on the fans during active in-service operation of the forklift vehicle.

The thermal management system and battery assembly shown in FIG. 6 together provide a power supply apparatus that may be installed in or otherwise associated with any suitable battery-powered vehicle or installation. In specific applications, such apparatus may be configured as a portable modular rechargeable power supply unit, to provide a portable power source that is amenable to fast charging. For such purpose, the power supply apparatus may be packaged in a unitary housing or cabinet, equipped with handles, grips, or other structural elements facilitating transport and ready deployment of the apparatus.

The thermal management system in the FIG. 6 embodiment thus includes a forced-air driver arranged for directional flow of cooling air over the battery to dissipate heat generated by the battery, and terminal and strap covers that assist the dissipation of heat from the battery while providing protection of the terminals against short-circuiting contacts with extraneous structures or articles in the work environment of the battery.

Figure 7:
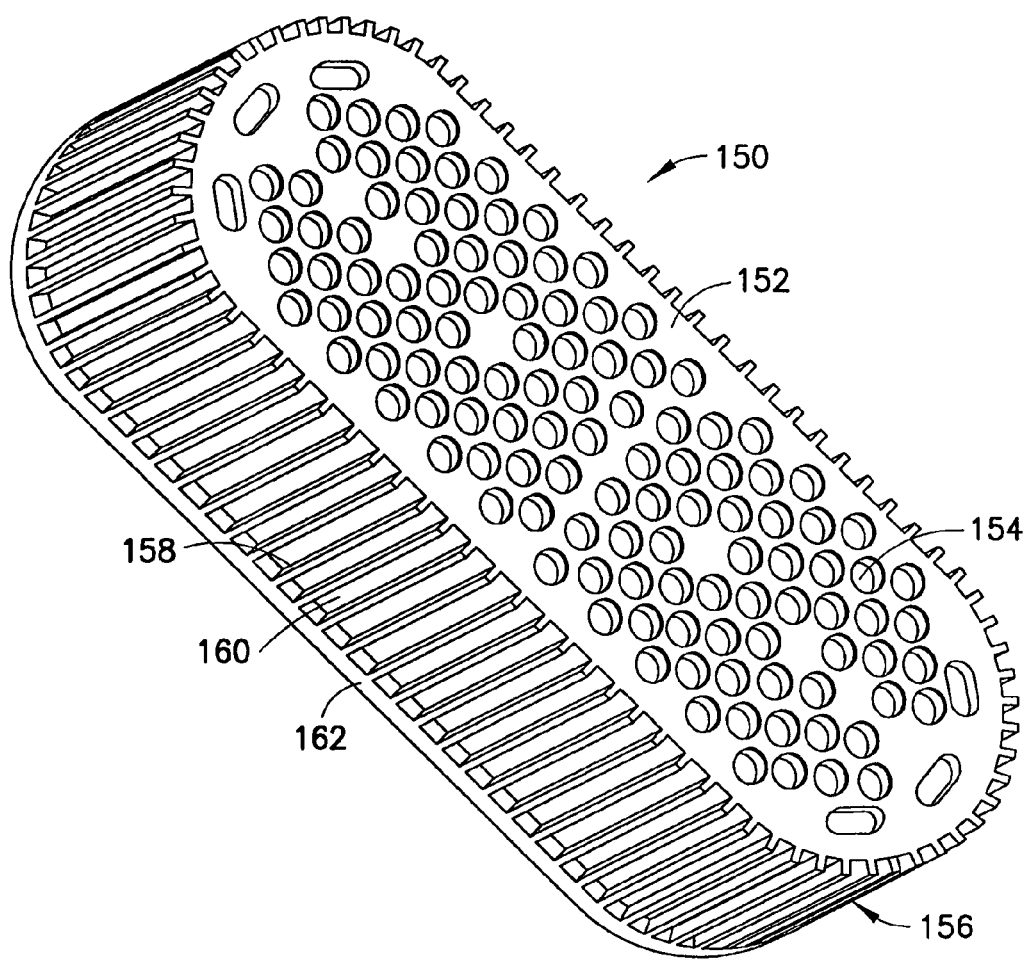
FIG. 7 is a perspective view of a battery terminal and strap cover providing enhanced convective heat transfer in the region of the battery terminals and straps, according to one specific embodiment of the invention.

FIG. 7 is a perspective view of a battery terminal and strap cover 150 providing enhanced convective heat transfer in the region of the battery terminals and straps, according to one specific embodiment of the invention.

The cover 150 as illustrated is of elongate form with a racetrack edge profile of its top member 152 constituted by parallel side edges and semicircular profile end portions. The top member 152 has an array of openings 154 therein. As shown in FIG. 7, these openings include circular openings along a major length of the cover between its respective ends, with openings at the ends being of elongate slot-like form with rounded extremities. The slot-like openings are aligned in a manner generally aligned with the adjacent edge surface of the main top member, as illustrated.

These openings 154 accommodate through-flow of gas for cooling of the battery terminal and strap structure, when the cover is mounted with the end portions of the cover on the terminals with the medial portion of the cover overlying the strap interconnecting the terminals, and gas is flowed through the cover by action of the fan or other motive air driver.

Figure 8:
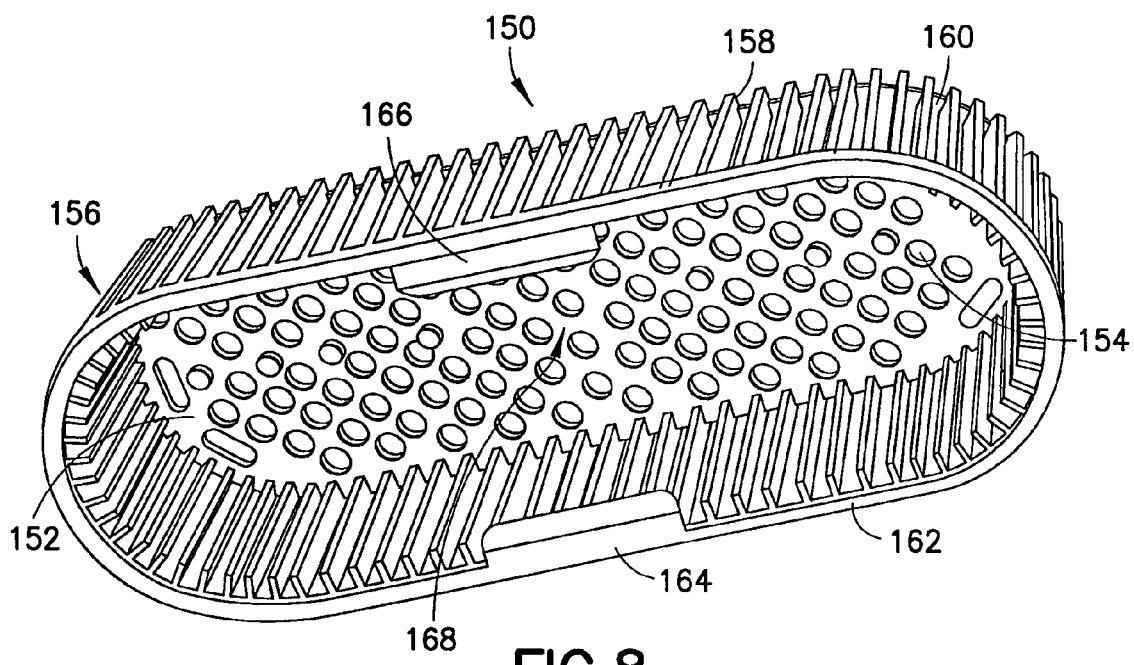
FIG. 8 is a perspective view of the battery terminal and strap cover of FIG. 7, showing the interior structure of such cover.
Figure 9:
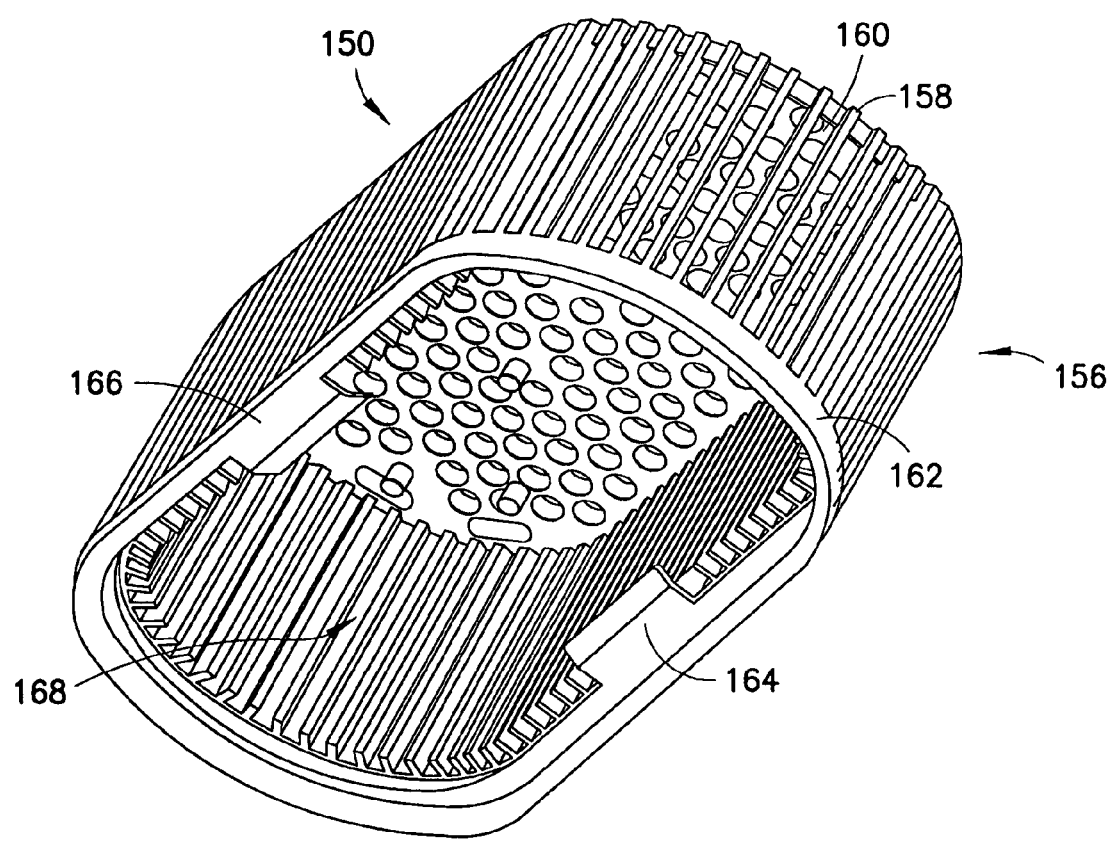
FIG. 9 is a perspective view of the battery terminal and strap cover of FIG. 7 in a different orientation than shown in FIG. 8, to show the interior structure of the cover.

The top surface member 152 is joined at its edges to a circumscribing sidewall 156 extending downwardly from the top surface member to a lower extremity at the circumscribing edge member 162 defining an open lower face of the cover, as shown in FIGS. 8 and 9.

The perspective view of FIG. 7 shows the sidewall 156 as including a series of laterally spaced-apart, vertically extending ribs 158, defining successive slot openings 160 between successively adjacent ribs 158.

The cover 150 may be formed of any suitable material of construction, e.g., ceramics, plastics, composite materials, etc. having a suitable insulative character. The cover may be molded, machined, cast, or fabricated in any other suitable manner. The nature, orientation and shape of the openings on the top member 152 as well as the openings in the side wall 156 can be widely varied in the broad practice of the invention, as may be advantageous in specific applications.

The cover is of a size and shape appropriate to the terminals and strap structure of batteries on which the cover is employed, so that the cover over-fits the terminals and strap member interconnecting such terminals, in a manner consistent with the protective function and cooling utility of the cover.

The sidewall of the cover has a slotted conformation as shown, to allow egress of cooling air introduced for contacting the terminals and strap structure, after the cooling air has entered the cover through openings therein and contacted the terminals and strap structure.

FIG. 8 is a perspective view of the battery terminal and strap cover 150 of FIG. 7, oriented to show the interior structure of such cover. FIG. 9 is a perspective view of the battery terminal and strap cover 150 of FIG. 7 in a different orientation than shown in FIG. 8, to further show the interior structure of the cover. The same reference numerals in FIGS. 8 and 9 identify the same parts as shown in FIG. 7.

As illustrated in FIGS. 8 and 9, the cover 150 has an open bottom face and an open interior volume 168 bounded by the circumscribing sidewall and the top surface member 152. The circumscribing edge member 162 at the bottom of the sidewall 156 includes longitudinally extending medial portions of the sidewall that are parallel to one another, with such medial sidewall portions extending between the respective semi-cylindrical end portions of the sidewall. Intermediate the respective end portions of the cover, flange elements 164 and 166 extend inwardly from the circumscribing edge member 162. These inwardly extending flange elements serve to position the cover under a strap member, so that the cover is positionally retained in proper location on the battery assembly.

Figure 10:
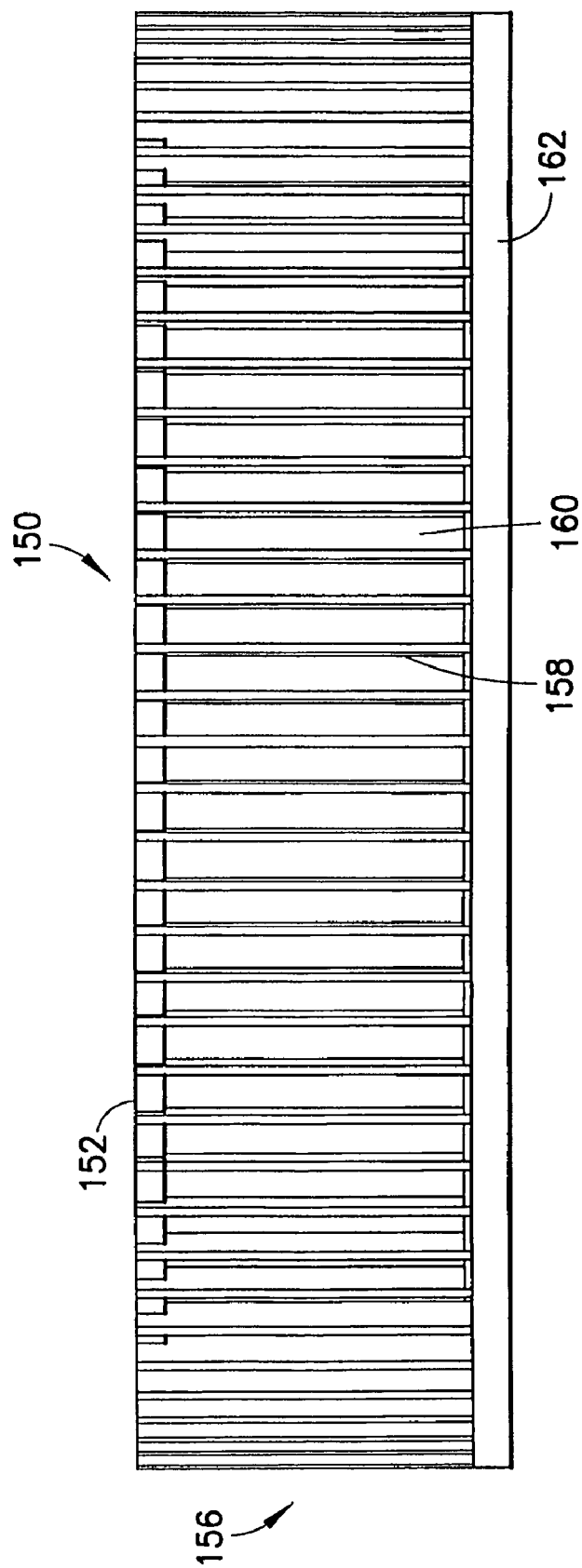
FIG. 10 is a side elevation view of the cover of FIG. 7.
Figure 11:
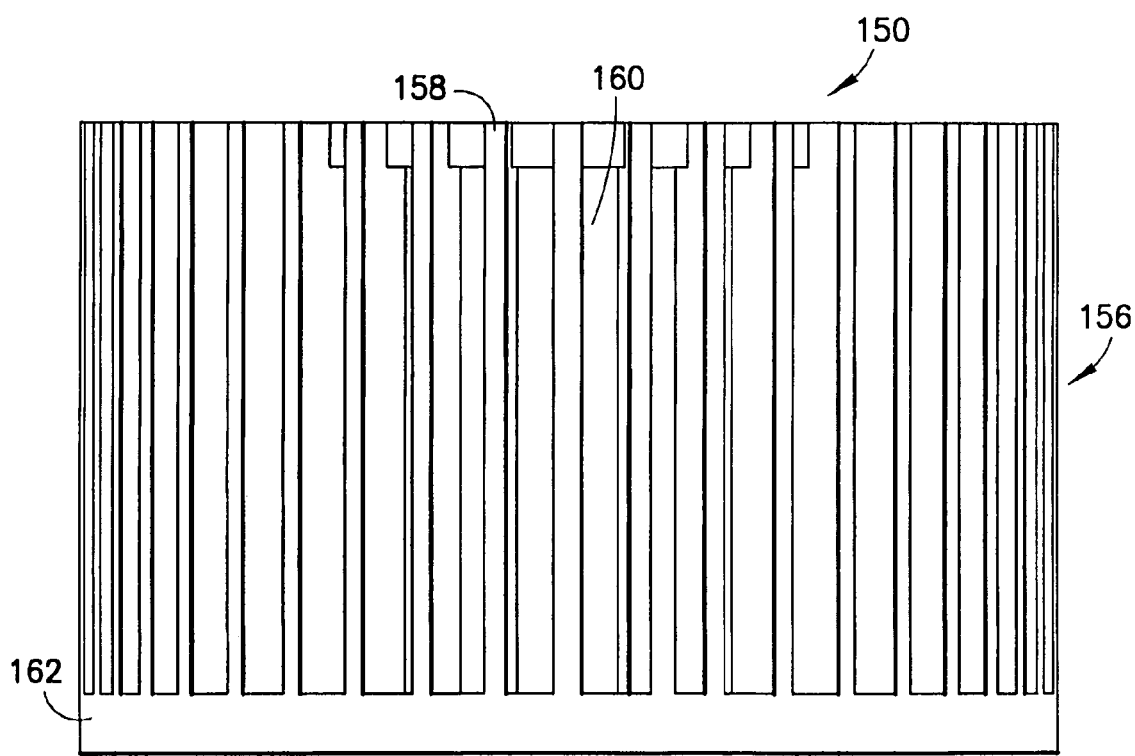
FIG. 11 is an end elevation view of the cover of FIG. 7.

FIG. 10 is a side elevation view, and FIG. 11 is an end elevation view, of the battery terminal and strap cover 150 of FIGS. 7-9, wherein all structural parts are correspondingly numbered in relation to FIGS. 7-9. As shown, the sidewall slot openings 160 are bounded by the vertically extending ribs 158. The vertical ribs at their upper ends are joined to the top member 152 and at their lower ends are joined to the circumscribing edge member 162.

The cover 150 thereby forms a protective enclosure that permits inflow of cooling air through the openings 154 in top surface member 152 and outflow of cooling air from the interior volume 168 within the cover, through the egress openings 160. Such arrangement allows through-flow of cooling air, to dissipate heat generated by the battery, in a highly efficient manner.

Figure 12:
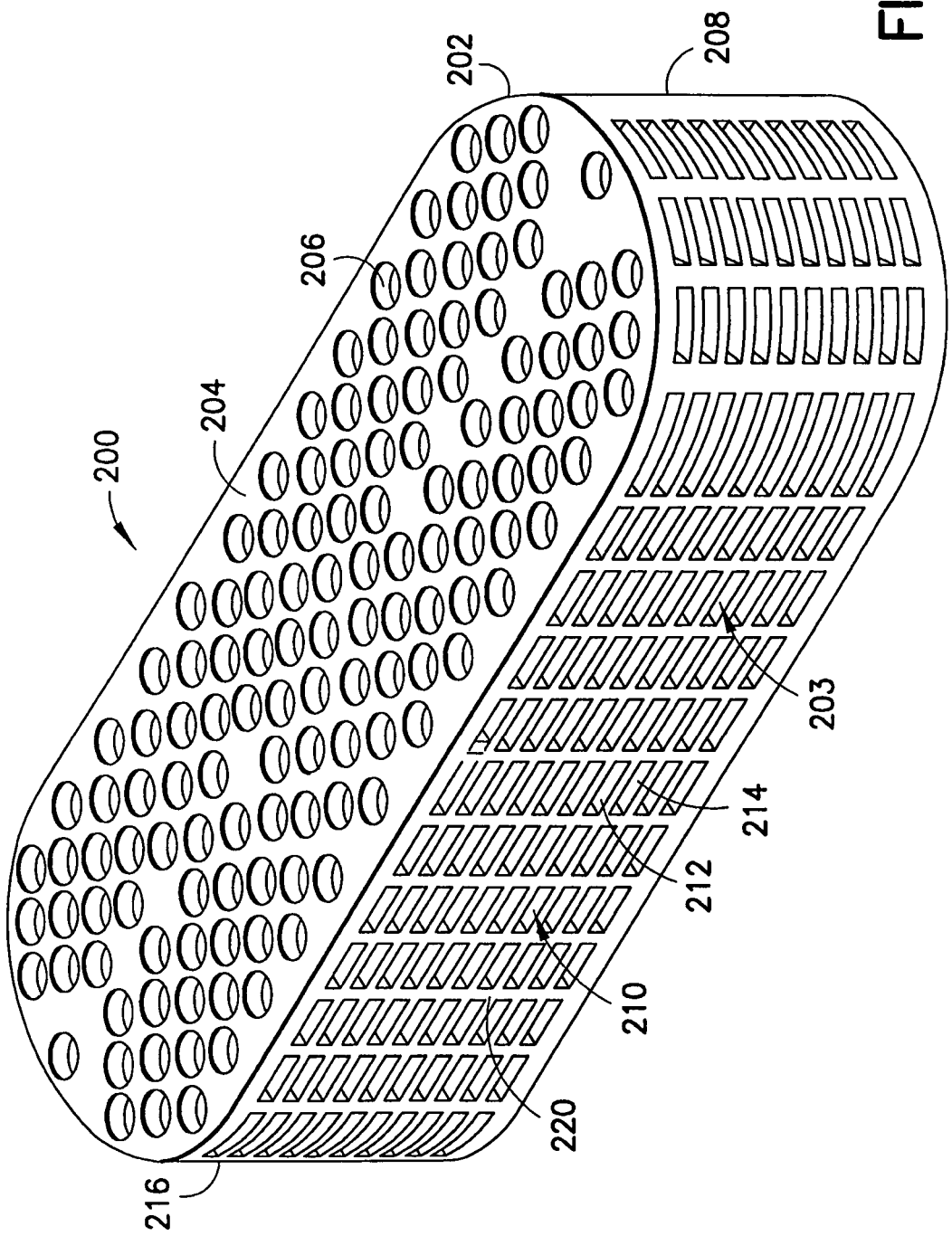
FIG. 12 is a perspective view of a battery terminal and strap cover providing enhanced convective heat transfer in the region of the battery terminals and straps, according to another specific embodiment of the invention.

FIG. 12 is a perspective view of a battery terminal and strap cover 200 providing enhanced convective heat transfer in the region of the battery terminals and straps, according to another illustrative embodiment of the invention.

As shown in FIG. 12, the battery terminal and strap cover 200 is formed as a unitary article having a main body 202 including a foraminous top surface member 204 with an array of openings 206 therein.

Figure 13:
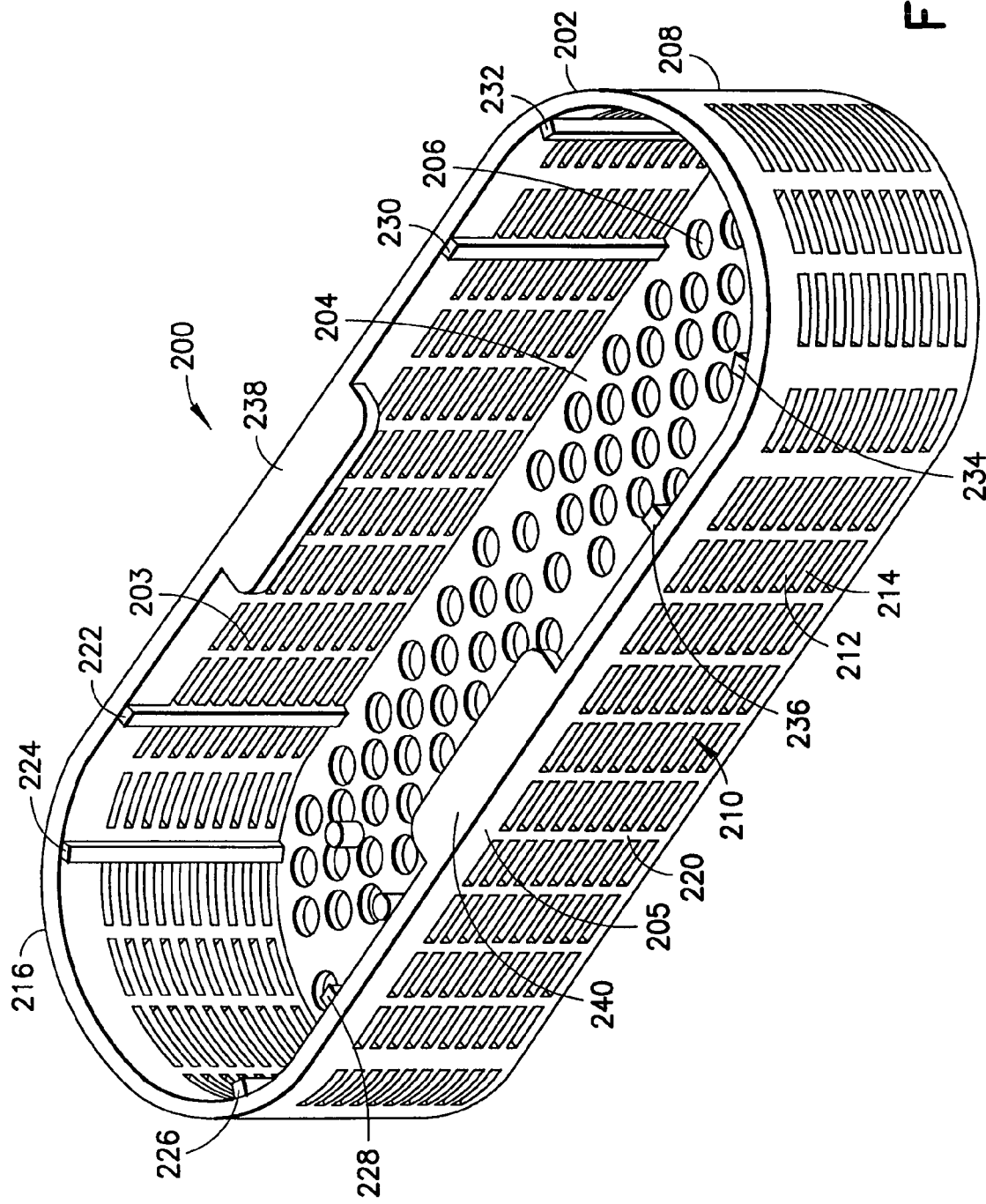
FIG. 13 is a perspective view of the battery terminal and strap cover of FIG. 12, in inverted position relative to the orientation shown in FIG. 12.

The main body 202 is of elongate form, extending from a first end portion 208 to a second end portion 216. The respective end portions have a semicircular edge profile in top plan view, and the medial portion of the cover body 202 therebetween has parallel side edges. The top surface member 204 is integrally formed with the circumscribing sidewall extending downwardly therefrom to a lower extremity defining an open lower face of the cover, as shown in FIG. 13 hereof. It is noted that this body may be of rectangular or other shape(s) and still provide the desired functionality.

The perspective view shown in FIG. 12 shows the sidewall 203 as including a series of successive laterally adjacent, and vertically extending, slotted and slatted arrays 210, wherein each successive slotted and slatted array is bounded at each of its lateral edges by a vertically upwardly extending spar member 220, and with the array comprising a series of laterally extending slats, wherein adjacent slats 212, 214 bound an opening therebetween of rectangular shape. The spar members in such arrangement are laterally spaced apart around the full circumferential extent of the sidewall.

The sidewall, at the end portions 208 and 216 of the cover 200, as well as at the medial portion between the end portions, is formed with the slotted and slatted wall structure. It is noted that the nature, orientation and shape of the openings can be widely varied without adverse affect on the desired functionality.

The top surface member 204 of the cover is perforate in character to allow flow therethrough of cooling air, and the cover is of a size and shape appropriate to the terminals and strap structure of batteries with which the cover is employed, so that the cover over-fits the terminals and strap member interconnecting such terminals.

The sidewall of the cover has a slotted and slatted wall conformation as illustrated, to allow egress of cooling air introduced for contacting the terminals and strap structure, after the cooling air has entered the cover through top or side surface member openings 206 and contacted the terminals and strap structure.

FIG. 13 is a perspective view of the battery terminal and strap cover 200 of FIG. 12, in inverted position relative to the orientation shown in FIG. 12. The same reference numerals in FIG. 13 identify the same parts as shown in FIG. 12.

As shown in FIG. 13, the cover 200 has an open bottom face and an open interior volume bounded by the circumscribing sidewall and the top surface member 204. The longitudinally extending medial portions 203 and 205 of the sidewall are parallel to one another, and extend between the respective semi-cylindrical end portions 208 and 216 of the sidewall. Intermediate the respective end portions of the cover, at the lower edge of the circumscribing sidewall, are inwardly extending flange elements 238 and 240. These inwardly extending flange elements 238 and 240 serve to position the cover under a strap member, so that the cover is positionally retained in proper location on the battery assembly.

The end portion 216 of the cover has associated therewith on the interior surface of the circumscribing sidewall vertically extending ribs 222, 224, 226 and 228. End portion 208 likewise has associated therewith on the interior surface of the circumscribing sidewall vertically extending ribs 230, 232, 234 and 236. The purpose of ribs 222, 224, 226, 228, 230, 232, 234 and 236 is to allow a press-fit positioning of the cover on the respective terminals of the battery assembly, so that the vertically extending ribs bear compressively against the side surfaces of the terminals and positionally maintain the cover in a fixed and secure location on the battery assembly.

Figure 14:
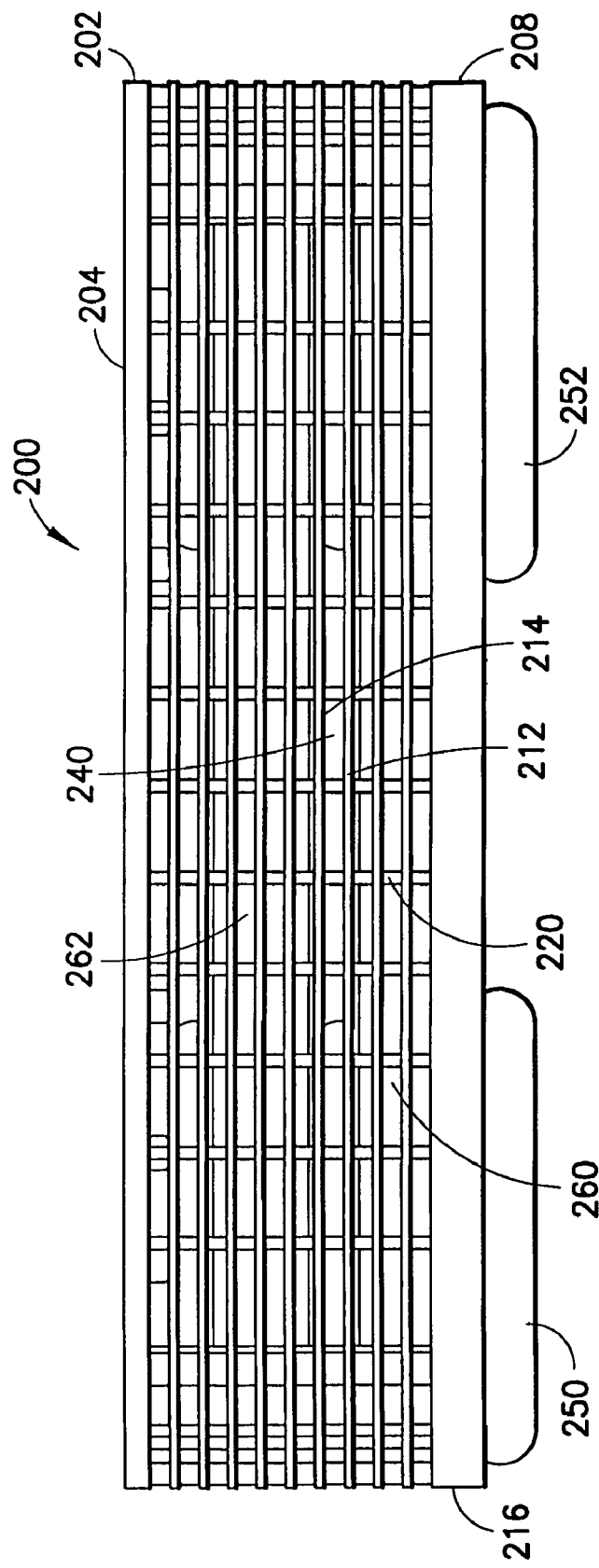
FIG. 14 is a side elevation view of the battery terminal and strap cover of FIGS. 12 and 13, as mounted on a terminals and strap assembly of a high capacity battery.

FIG. 14 is a side elevation view of the battery terminal and strap cover 200 of FIGS. 12 and 13, as mounted on a terminals and strap assembly of a high capacity battery.

The cover 200 as shown in FIG. 14 is mounted on terminals 250 and 252 of an associated battery assembly, and these terminals are interconnected by terminal straps 260 and 262. The circumscribing sidewall of the cover 200 includes the vertically upstanding spar members 220, between which is a series of vertically spaced-apart slats. Each pair of successively adjacent slats 212, 214 has an opening 240 of rectangular shape therebetween, as illustrated.

By the construction shown, the cover 200 forms a protective enclosure that permits inflow of cooling air through the perforations in top surface member 204 and outflow of cooling air from the interior volume within the cover, through the egress openings 240. Such arrangement allows through-flow of cooling air, to dissipate heat generated by the battery, in a highly efficient manner.

Figure 15:
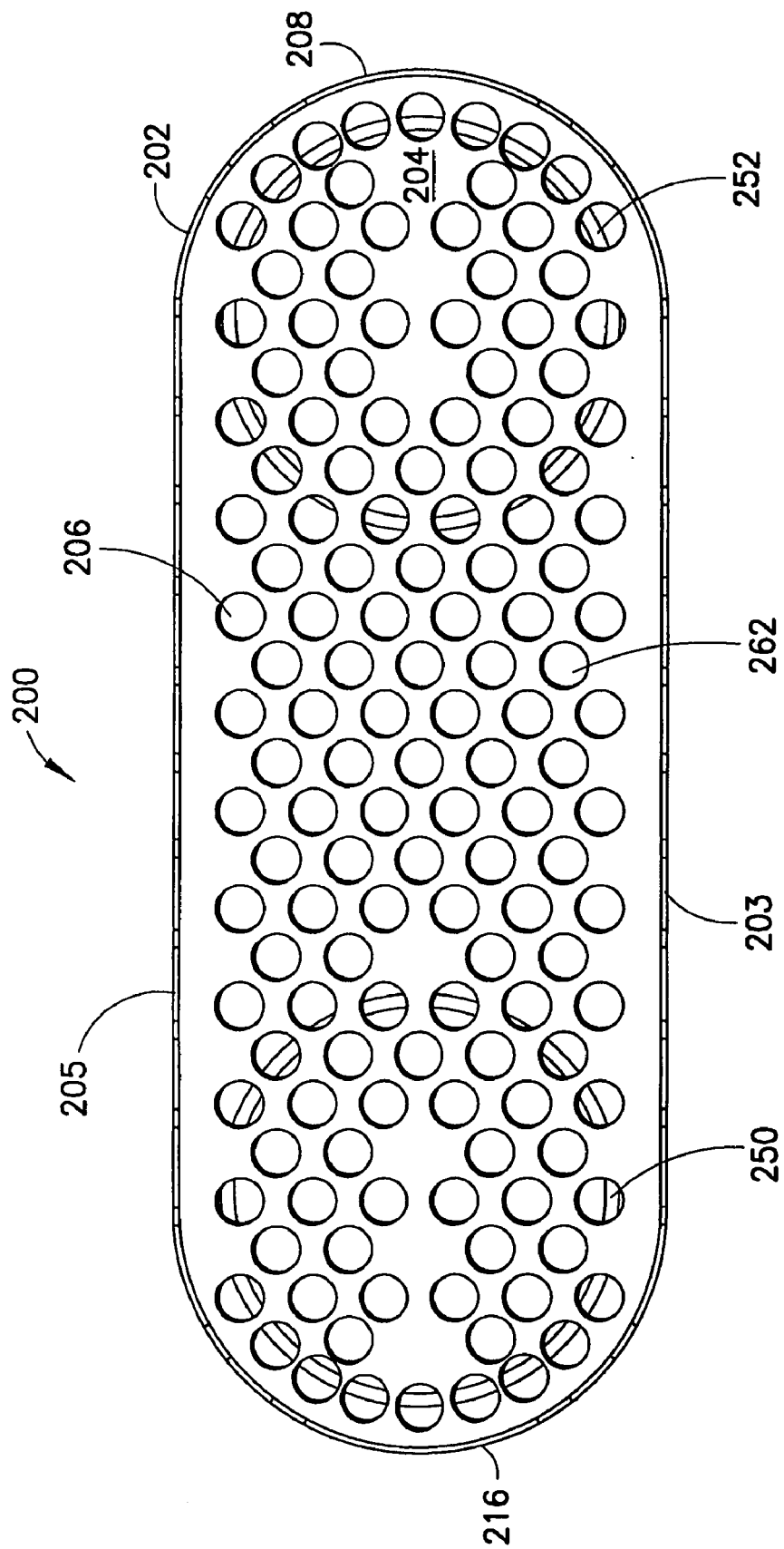
FIG. 15 is a top plan view of a battery terminal and strap cover of FIGS. 12-14, as mounted on a terminals and strap assembly of a high capacity battery.

FIG. 15 is a top plan view of the battery terminal and strap cover 200 of FIGS. 12-14, as mounted on a terminals and strap assembly of a high capacity battery.

The cover 200 is shown as including a cover body 202 of elongate racetrack conformation. The cover body 202 includes end portions 208 and 216 of the circumscribing sidewall, and parallel and longitudinally extending medial sidewalls 203 and 205. The top surface member 204 of the cover has an array of perforation openings 206 therein. The cover as installed on the battery overlies and protectively encloses terminal strap 262 and associated terminals 250 and 252.

It will be recognized that the cover structures as shown and described with reference to FIGS. 7-15 are of an illustrative character only, and that the cover may be modified in various respects. The cover may be formed as a multi-piece or as a single-piece article. In addition, the top surface of the cover may be arranged with openings of a different size, shape and density (pitch of openings, and arrangement of same) than shown in FIGS. 7-15, as appropriate to a specific battery assembly and cooling operation.

For example, the main top surface of the cover may be constituted by a screen, open grid or grill structure, tapered openings to focus the coolant flow, etc. The openings in the main top surface may be directionally oriented, so as to preferentially focus the flow of cooling gas onto the terminals, or to preferentially direct the flow of cooling gas obliquely onto the terminal strap, and/or in any other manner as appropriate to assist the cooling effect achieved by gas flow through the cover.

In like manner, the sidewall openings of the cover may be of any suitable size, shape and density appropriate to the specific battery assembly and associated cooling operation involved.

For example, the slotted and slatted wall surface of the cover shown and described with reference to FIGS. 12-15 may include louvered (slanted) slats to facilitate the egress of cooling gas from the interior volume of the cover in a directional manner enhancing the cooling process, relative to other egress opening geometries that may be less effective for maximizing heat removal from the battery.

The vertical rib-bounded sidewall openings of the cover embodiment shown in FIGS. 7-11 may likewise be modified, with the ribs being differently oriented and/or shaped to provide heat dissipation of a different character than is achievable with the cover embodiment of FIGS. 7-11.

The cover structure may be of a specific design that readily accommodates a specific method of manufacture of the cover, e.g., injection molding of the cover structure or component parts thereof that are subsequently assembled to provide the product cover article.

As another modification, the cover may be formed with air flow interruption elements, such as wire elements, turbulator bars, flow-splitter structures, and the like, to enhance the effectiveness of the hydrodynamic flow of cooling gas and maximize heat transfer from the solid surfaces of the terminals and straps for convective heat removal from the battery.

Figure 16:
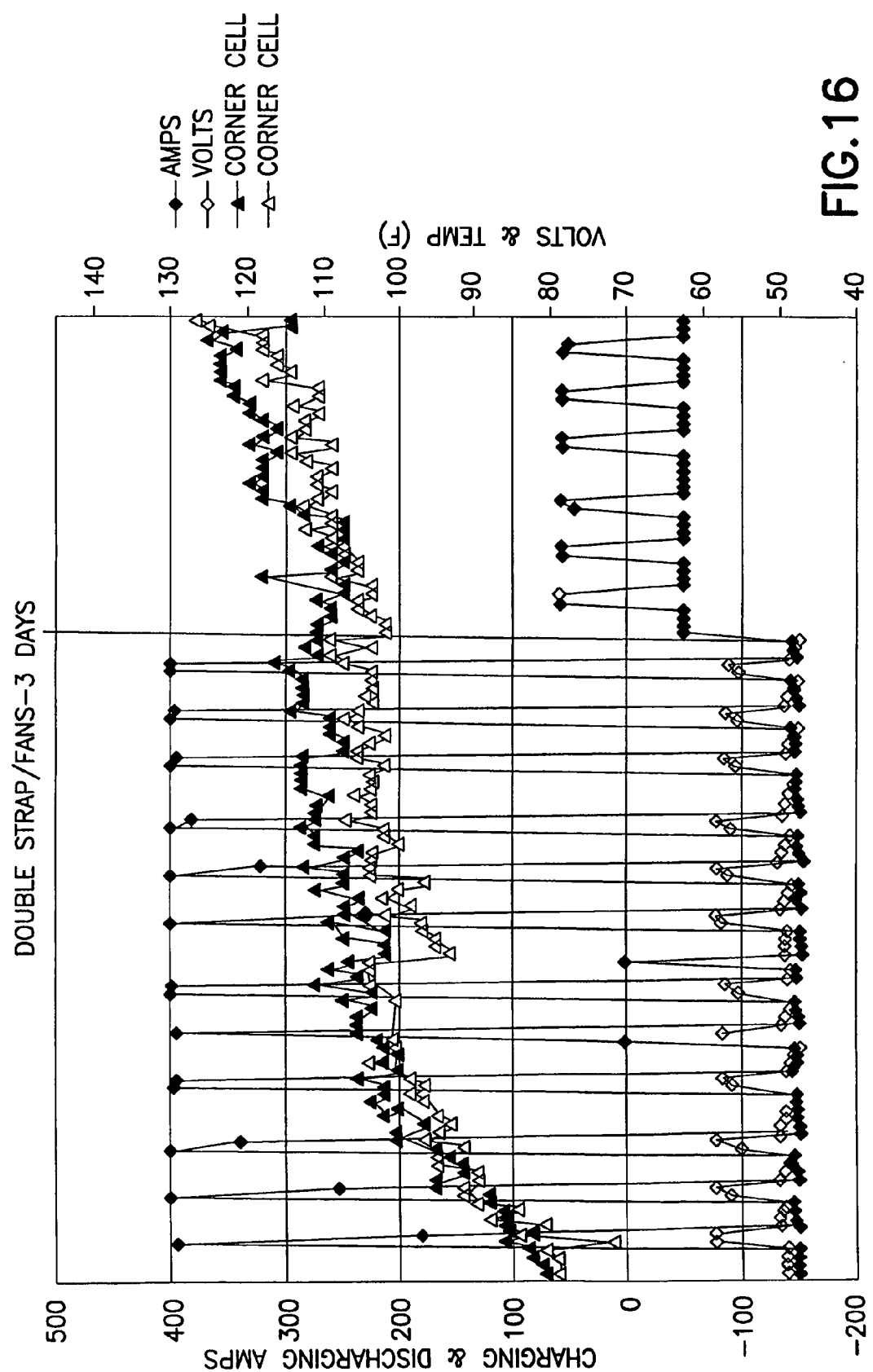
FIG. 16 is a graph of charging and discharging amperage, voltage and temperature, for a double-strapped assembly of batteries cooled in accordance with the present invention, over a period of operation of three days.

FIG. 16 is a graph of charging and discharging amperage, voltage and temperature, for a double-strapped assembly of batteries cooled in accordance with the present invention, using a dual assembly of down-draft fans, over a period of operation of three days, on a forklift battery-powered truck.

This graph shows the voltage and amperage associated with the fast charging and the subsequent operational use of the batteries. The graph shows the voltage and temperature, in degrees Fahrenheit, during such fast charging and operational use. The results show that the provision of forced convection fans on the forklift battery-powered truck served to maintain battery temperatures at levels enabling high-efficiency fast charging to be achieved. Further, the data show that the corner cell in the multi-cell battery array and the center cell in such array were maintained at consistent temperatures with respect to one another, reflecting the fact that each of such cells in the array was effectively cooled (i.e., a center cell was not substantially hotter than a center cell in the array).

Figure 17A:
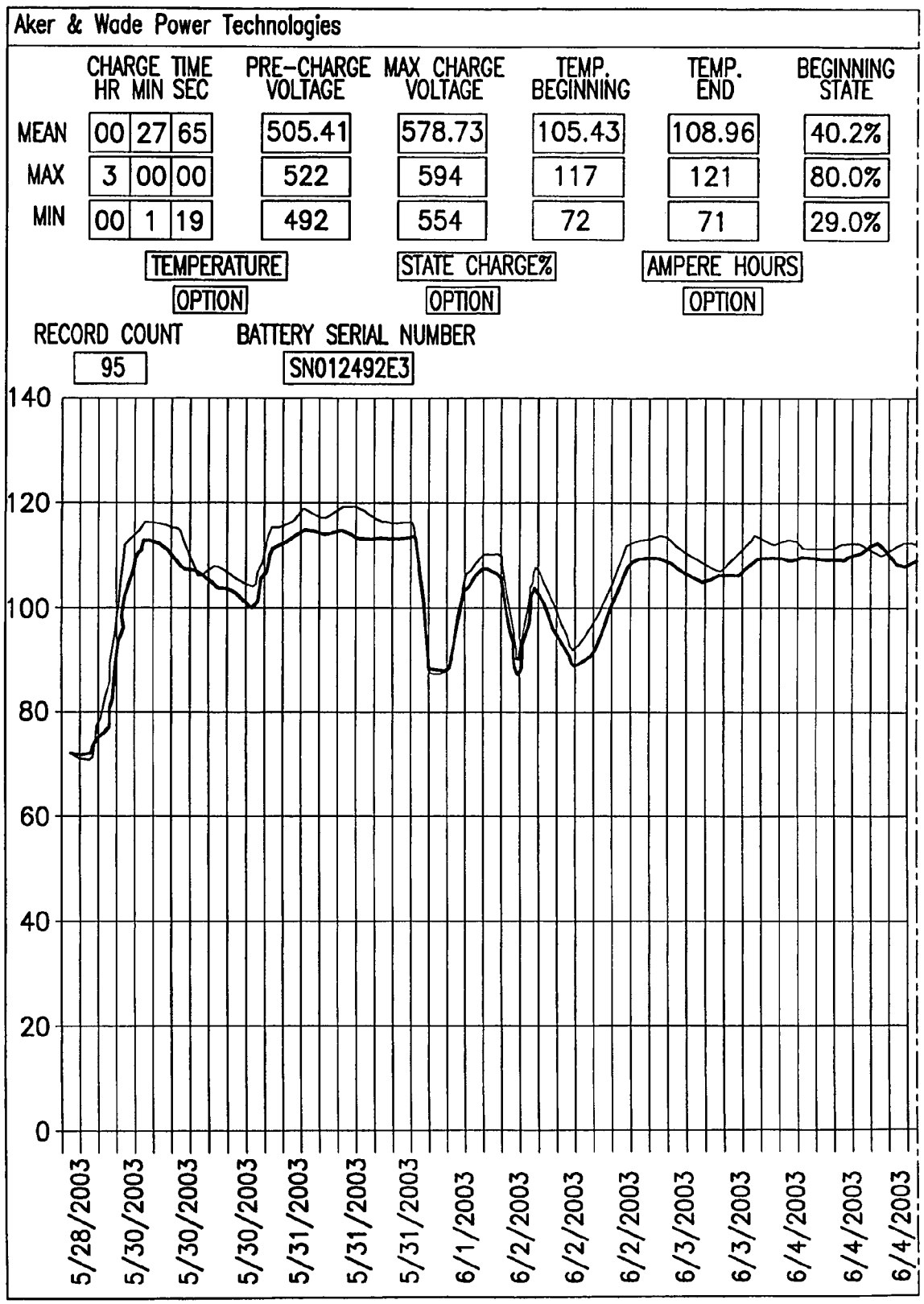
FIG. 17 is a graph, for the same time period as FIG. 16, of battery temperature during forklift operation for the battery whose characteristics are shown in FIG. 16.
Figure 17B:
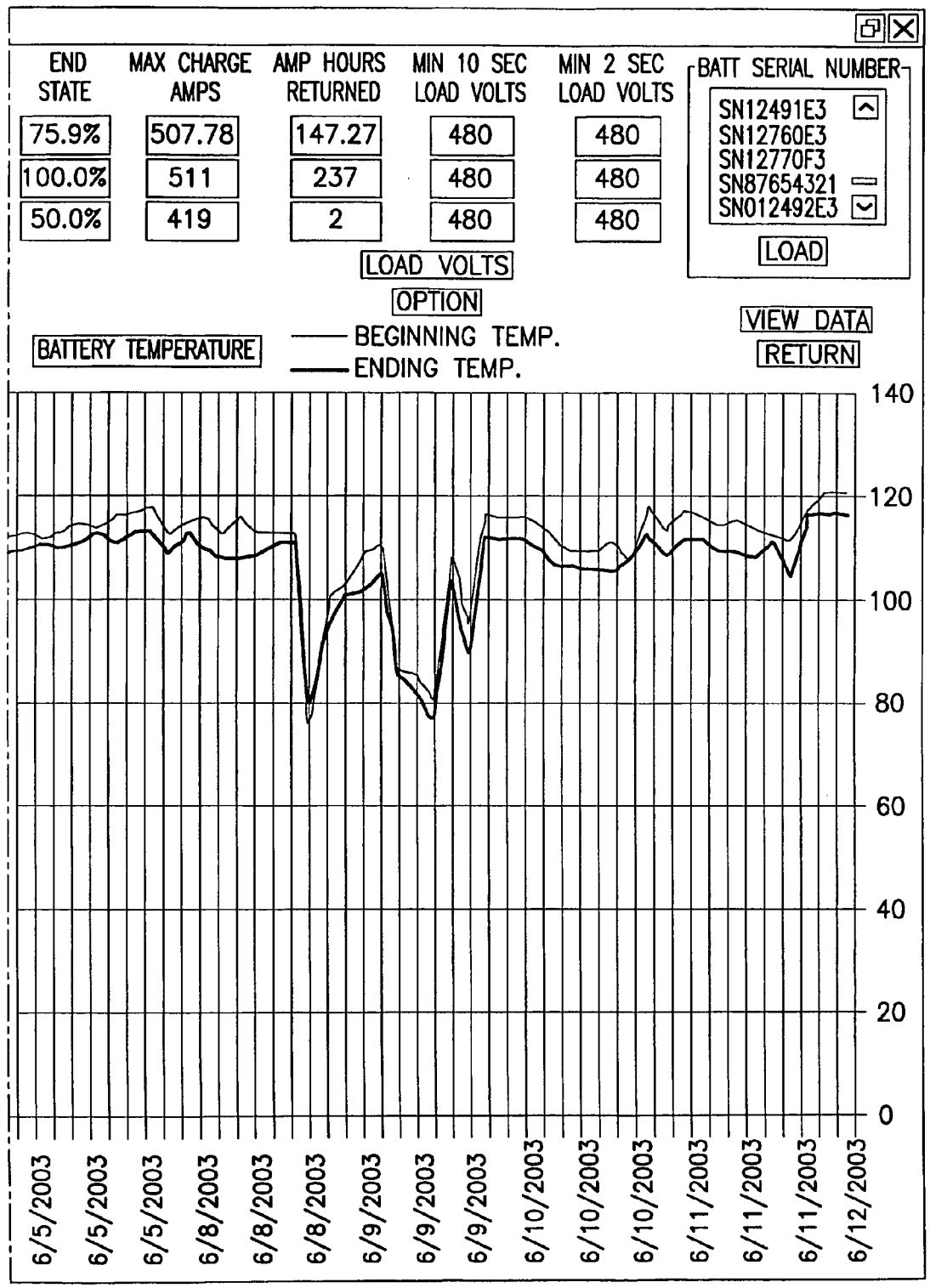

FIG. 17 is a graph, for the same time period as FIG. 16, of battery temperature during battery-powered forklift truck operation for a battery whose characteristics are shown in FIG. 16. These graphical data show that the ending temperature was maintained in close relationship to beginning temperature.

The data thereby show that the cooling operation was effective in dissipating heat generated in the fast charging operation, that would otherwise have significantly raised the ending temperature (at the end of the fast charging operation) in relation to the beginning temperature (at the inception of fast charging). Thus, the temperature was maintained at a level consistent with rapid fast charging of the battery assembly.

Figure 18A:
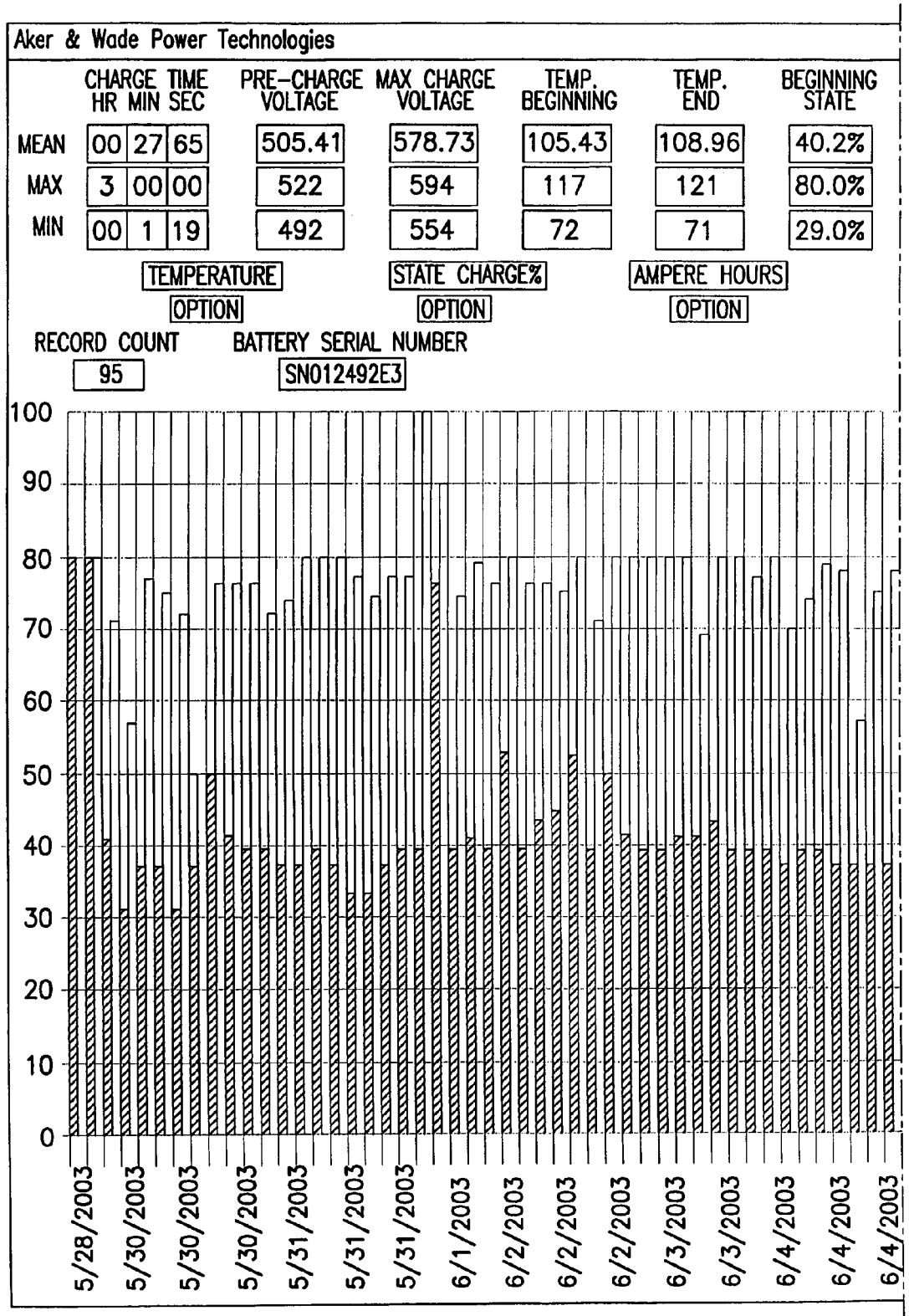
FIG. 18 is a graph of state of charge as a function of time for a battery-powered forklift battery over a period of sixty days, during which the battery was fast-charged at regular intervals. The figure also shows various charging-related parameters including voltage, amperage and temperature.
Figure 18B:
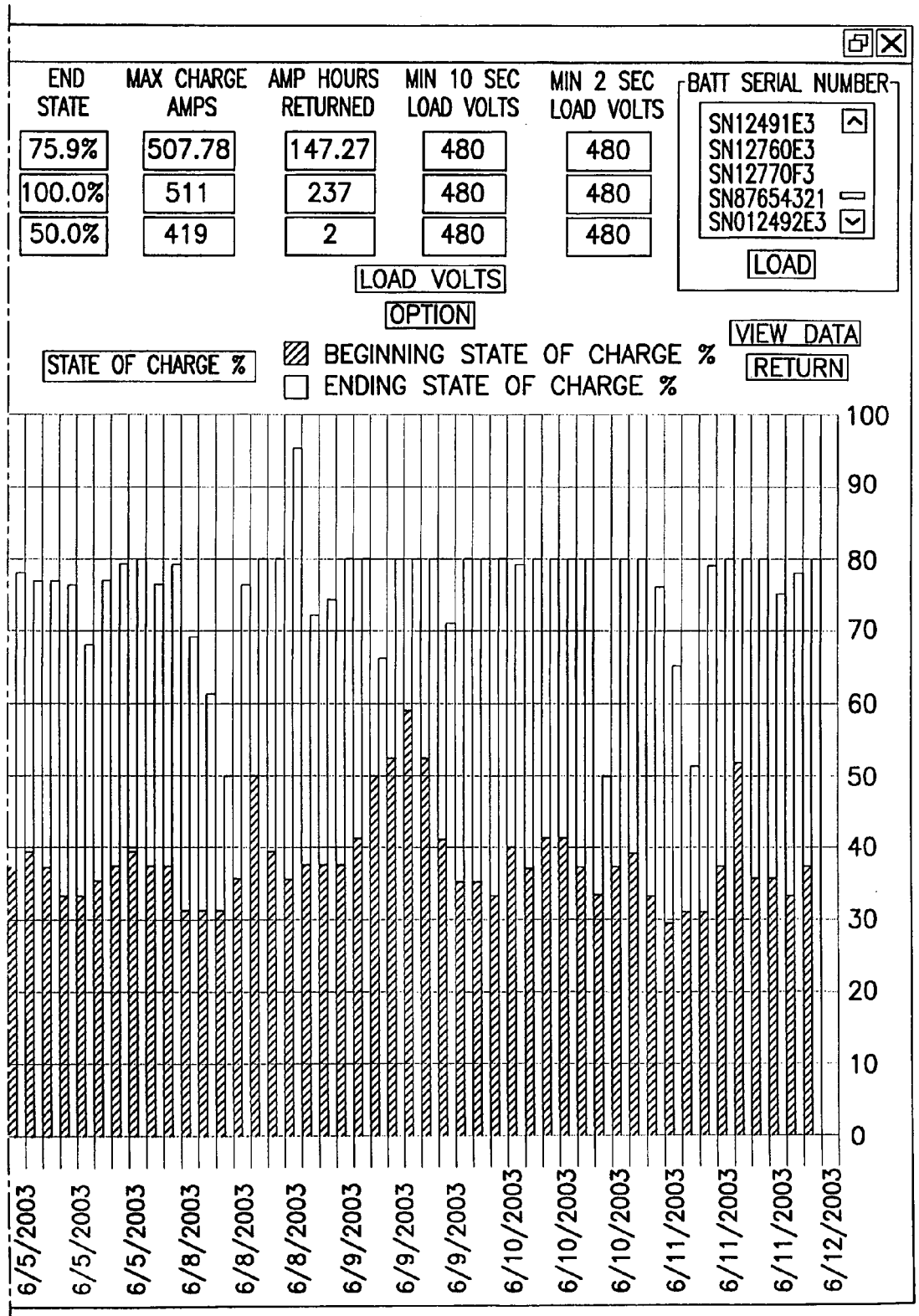

FIG. 18 is a graph of state of charge as a function of time for a battery-powered forklift truck over a period of sixty days, during which the battery was fast-charged at regular intervals. The figure also shows various charging-related parameters including voltage, amperage and temperature.

The graphical data of FIG. 18 show that the beginning state of charge for the fast charging operation was typically in a range of from about 30% to about 60%, and that the ending state of charge was generally in the range of 70-80%. The associated tabulation of charging-related parameters show that the mean beginning temperature in the charging operation was 105.43° F. for a mean beginning state of charge of 40.2% and the mean ending temperature was 108.96° F. for a mean ending state of charge of 75.9%, with a mean charging time of 27 minutes 65 seconds, a mean maximum charge voltage of 57.9 volts and a mean maximum charge amperage of 507.78 amps.

These data show that the fast charging operation was conducted at relatively low temperature levels that were maintained at low level throughout the fast charging operation, and that fast charging was conducted in a time-frame far shorter than has been achievable by use of prior art conventional charging technologies.

Accordingly, the performance data of FIGS. 16-18, obtained with forklift battery-powered trucks utilizing dual downdraft fans for forced convective cooling, shows that the thermal management system of the invention enabled a high efficiency fast charging operation to be achieved, in which low temperatures of terminals and interconnecting strap members were maintained during the charging process.

While the invention has been described with respect to particular features, aspects and embodiments, it will be recognized that the invention is not thus limited, but rather extends to and encompasses numerous variations, modifications and alternative embodiments, such as will suggest themselves to those of ordinary skill in the art, based on the disclosure herein.

Accordingly, the invention is intended to be broadly construed and interpreted, as encompassing all such variations, modifications and alternative embodiments, within the spirit and scope of the ensuing claims.

What is claimed is:

1. A thermal management system for cooling of a high-capacity battery including a longitudinally extending top face having terminals thereon, said thermal management system comprising a plate member overlying the entire top face of the battery and parallelly aligned with said top face to form a gap therebetween, the gap at an outer side edge thereof defining a gap opening extending continuously along the full longitudinal extent of said top face, between the plate member and the top face of the battery, with said gap opening communicating with an ambient environment of the thermal management system, said plate member including at least one opening therein, wherein each plate member opening has a cylindrical collar disposed therein, with a fan mounted in the collar to effect down-flow of air drawn from the ambient environment onto the high-capacity battery during at least one of (a) fast charging of the battery, and (b) use of the battery generating heat, so that the air contacting the top face of the battery flows laterally outwardly across the top face of the battery and is laterally discharged through said gap opening into the ambient environment.

2. The thermal management system of claim 1, further comprising a terminal and strap cover mountable on a pair of strapped terminals on said top face of the battery to cover the terminal and strap connected thereto, said cover including a main top member and a circumscribing sidewall joined to the main top member, wherein the main top member has cooling gas flow openings therein, and the circumscribing sidewall includes side portions and end portions, wherein said side portions and end portions have cooling gas flow openings therein.

3. The thermal management system of claim 2, wherein said openings along end portions of the circumscribing sidewall of said terminal and strap cover comprise vertically extending slot openings.

4. The thermal management system of claim 3, wherein the vertically extending slot openings are defined by a series of laterally spaced-apart vertical ribs extending between the main top member and a circumscribing edge member at the lower end of the circumscribing wall.

5. The thermal management system of claim 4, wherein the openings in the main top member comprise circular openings.

6. The thermal management system of claim 5, wherein the openings in the main top member further comprise openings, at respective ends of the main top member, of elongate form with rounded extremities.

7. The thermal management system of claim 6, wherein the elongate form openings are each generally aligned with an adjacent edge surface of the main top member.

8. The thermal management system of claim 2, wherein said openings along end portions of the circumscribing sidewall comprise slotted and slatted openings.

9. The thermal management system of claim 2, wherein the circumscribing wall includes successive vertically spaced-apart slats, wherein each of adjacent slats defines therebetween a rectangular opening.

10. The thermal management system of claim 9, wherein the openings on the main top member comprise circular openings.

11. The thermal management system of claim 2, wherein the circumscribing wall includes laterally spaced-apart vertically extending spar elements having vertically spaced-apart slats extending therebetween to form slotted and slatted openings.

12. The thermal management system of claim 2, wherein spar elements are laterally spaced apart around the full circumferential extent of the circumscribing wall to form a corresponding series of arrays of slotted and slatted openings.

13. The thermal management system of claim 2, further comprising on respective end portions of the circumscribing wall vertically extending, laterally spaced-apart ribs for press-fit mounting of the cover on battery terminals.

14. The thermal management system of claim 1, further comprising thermal monitoring circuitry arranged to monitor battery temperature and to actuate the fan(s) when battery temperature rises above a predetermined set point value.

15. The thermal management system of claim 14, wherein said thermal monitoring circuitry comprises a monitoring device selected from the group consisting of thermocouples, thermistors, and thermostats.

16. The thermal management system of claim 14, wherein said thermal monitoring circuitry comprises switches for actuating the fan(s).

17. The thermal management system of claim 1, further comprising load-sensing circuitry arranged to monitor battery load and to actuate the fan(s) when the battery is being discharged in use.

18. The thermal management system of claim 1, further comprising current-draw monitoring circuitry arranged to monitor battery current draw and to actuate the fan(s) when the battery is being discharged in use.

19. The thermal management system of claim 1, comprising multiple openings in said plate member.

20. The thermal management system of claim 19, further comprising a protective grate member mounted at the top open end of the cylindrical collar and overlying the fan mounted therein.

21. The thermal management system of claim 1, wherein the plate member overlying the high-capacity battery is hinged at one end thereof.

22. The thermal management system of claim 1, comprising multiple fans.

23. A vehicle adapted to be powered by a high-capacity battery including a top face having terminals thereon, said vehicle comprising a thermal management system as claimed in claim 1 arranged for cooling of said battery.

24. The vehicle of claim 23, wherein the battery comprises an array of high-capacity batteries wherein successive high-capacity batteries are arranged in abutting relationship to one another.

25. The vehicle of claim 23, wherein the battery is positioned in a battery compartment below a seat of the vehicle.

26. The vehicle of claim 23, comprising a forklift vehicle.

* * * * *